United States Patent
Wang

(10) Patent No.: US 9,823,716 B2
(45) Date of Patent: Nov. 21, 2017

(54) HEAT DISSIPATION APPARATUS AND ELECTRONIC DEVICE

(71) Applicant: Lenovo (Beijing) Limited, Beijing (CN)

(72) Inventor: Cuicui Wang, Beijing (CN)

(73) Assignee: Lenovo (Beijing) Limited, Beijing (CN)

(*) Notice: Subject to any disclaimer, the term of this patent is extended or adjusted under 35 U.S.C. 154(b) by 0 days.

(21) Appl. No.: 15/085,556

(22) Filed: Mar. 30, 2016

(65) Prior Publication Data

US 2017/0185113 A1    Jun. 29, 2017

(30) Foreign Application Priority Data

Dec. 28, 2015 (CN) .......................... 2015 1 1001223

(51) Int. Cl.
  *H05K 7/20* (2006.01)
  *G06F 1/20* (2006.01)
  (Continued)

(52) U.S. Cl.
  CPC .............. *G06F 1/20* (2013.01); *F28D 15/00* (2013.01); *F28F 3/042* (2013.01); *F28F 13/003* (2013.01);
  (Continued)

(58) Field of Classification Search
  CPC . G06F 1/181–1/182; H05K 7/20218–7/20381;
  (Continued)

(56) References Cited

U.S. PATENT DOCUMENTS

2002/0101718 A1* 8/2002 Negishi .................. F28F 3/025
                                                     361/699
2002/0163782 A1* 11/2002 Cole ..................... F25B 39/028
                                                     361/700
(Continued)

FOREIGN PATENT DOCUMENTS

CN         2521651 Y      11/2002
CN         1471159 A       1/2004
(Continued)

OTHER PUBLICATIONS

"First Office Action for Application No. 201511001223.0" The State Intellectual Property Office of People's Republic of China, dated Jul. 3, 2017, 14 pages.

*Primary Examiner* — Anthony Haughton
*Assistant Examiner* — Razmeen Gafur
(74) *Attorney, Agent, or Firm* — Kunzler Law Group

(57) ABSTRACT

Disclosed is a heat dissipation apparatus and an electronic device. The heat dissipation apparatus is suitable for a processor in an electronic device. The heat dissipation apparatus includes a housing including an inlet for introducing a cooling fluid into the housing and an outlet for allowing the cooling fluid to exit from the housing. The heat dissipation apparatus includes a heat dissipating member disposed in the housing. The heat dissipation apparatus includes a buffer member disposed between the inlet and the heat dissipating member. The buffer member includes through-holes for inhibiting a flow of the cooling liquid from the inlet of the housing to the dissipating member to transfer heat across the heat dissipating member to the cooling fluid. The electronic device may include a processor and the heat dissipation apparatus.

18 Claims, 3 Drawing Sheets

(51) Int. Cl.
*F28D 15/00* (2006.01)
*F28F 3/04* (2006.01)
*F28F 13/00* (2006.01)
*F28F 21/08* (2006.01)
*F28D 21/00* (2006.01)

(52) U.S. Cl.
CPC .......... *F28F 21/083* (2013.01); *F28F 21/084* (2013.01); *F28F 21/085* (2013.01); *H05K 7/20154* (2013.01); *H05K 7/20254* (2013.01); *H05K 7/20436* (2013.01); *F28D 2021/0028* (2013.01)

(58) Field of Classification Search
CPC ............ H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2005/0185378 A1* | 8/2005 | Tilton | ............... | H05K 7/20345 361/699 |
| 2007/0012423 A1* | 1/2007 | Kinoshita | ............. | H01L 23/473 165/80.4 |
| 2007/0183126 A1* | 8/2007 | Tilton | ............... | H01L 23/4735 361/699 |
| 2007/0272392 A1* | 11/2007 | Ghosh | ............... | H01L 23/4336 165/80.4 |
| 2007/0272397 A1* | 11/2007 | Reyzin | ................ | F28D 1/053 165/122 |
| 2008/0043440 A1* | 2/2008 | Fedorov | ............... | H01L 23/427 361/700 |
| 2008/0073061 A1* | 3/2008 | Dias | .................. | H01L 23/427 165/80.4 |
| 2008/0137299 A1* | 6/2008 | Zhang | ................. | F28D 15/02 361/699 |
| 2008/0266787 A1* | 10/2008 | Gosset | ............... | H01L 21/7682 361/689 |
| 2008/0278913 A1* | 11/2008 | Campbell | ................. | F28C 3/08 361/699 |
| 2009/0073652 A1* | 3/2009 | Matser | .............. | H05K 7/20745 361/691 |
| 2009/0122491 A1* | 5/2009 | Martin | ................. | H01L 23/367 361/708 |
| 2009/0129011 A1* | 5/2009 | Balzano | ................. | H01L 23/473 361/689 |
| 2009/0129021 A1* | 5/2009 | Dunn | ................. | H05K 7/20972 361/699 |
| 2009/0154104 A1* | 6/2009 | Kondo | ..................... | G06F 1/20 361/700 |
| 2009/0250195 A1* | 10/2009 | Yoshida | .................... | F28F 3/02 165/80.3 |
| 2010/0142150 A1* | 6/2010 | Campbell | ............. | H01L 23/473 361/702 |
| 2010/0259886 A1* | 10/2010 | Mongia | .................. | G06F 1/203 361/679.47 |
| 2010/0290188 A1* | 11/2010 | Brunschwiler | ........ | H01L 23/473 361/699 |
| 2010/0328888 A1* | 12/2010 | Campbell | ........... | H01L 23/4735 361/699 |
| 2010/0328890 A1* | 12/2010 | Campbell | ........... | F28D 15/0266 361/700 |
| 2011/0063792 A1* | 3/2011 | Schmidt | ................... | G06F 1/20 361/679.46 |
| 2012/0087087 A1* | 4/2012 | Nicolai | ............. | H05K 7/20836 361/679.48 |
| 2014/0029199 A1* | 1/2014 | Dede | ........................ | F28F 9/02 361/699 |
| 2014/0218861 A1* | 8/2014 | Shelnutt | ................... | G06F 1/20 361/679.53 |
| 2014/0268549 A1* | 9/2014 | Neumann | .......... | H05K 7/20772 361/679.47 |
| 2014/0301036 A1* | 10/2014 | Chainer | ............... | H05K 7/2079 361/679.47 |
| 2014/0376178 A1* | 12/2014 | Moore | ..................... | G06F 1/20 361/679.53 |

FOREIGN PATENT DOCUMENTS

| | | |
|---|---|---|
| CN | 2894209 Y | 4/2007 |
| CN | 102271485 A | 12/2011 |
| JP | 2005344974 A | 12/2005 |

\* cited by examiner

HEAT DISSIPATION APPARATUS AND ELECTRONIC DEVICE

FIELD

The subject matter disclosed herein relates to heat dissipation, and in particular, a heat dissipation apparatus and an electronic device.

BACKGROUND

With the development of science and technology, more and more functionalities are being integrated in electronic devices, and accordingly more and more applications are being installed on the electronic devices. Every application generates some heat during its operation, hence a large amount of heat is generated inside electronic devices during operation. The accumulation of excessive heat has a dramatic impact on the processing speed and service life of the processors in electronic devices.

SUMMARY

One embodiment of the present disclosure includes a heat dissipation apparatus. The heat dissipation apparatus includes a housing. The housing includes an inlet for introducing a cooling liquid into the housing. The housing includes an outlet for allowing the cooling fluid to exit from the housing. The heat dissipation apparatus includes a heat dissipating member disposed in the housing. The heat dissipation apparatus includes a buffer member disposed between the inlet and the heat dissipating member in the housing. The buffer member includes a plurality of through-holes for inhibiting a flow of the cooling liquid from the inlet of the housing to the heat dissipating member to transfer heat across the heat dissipating member to the cooling fluid.

One embodiment of the present disclosure includes an electronic device. The electronic device includes a processor. The electronic device includes a heat dissipation apparatus for transferring heat away from the processor. The heat dissipation apparatus includes a housing. The housing includes an inlet for introducing a cooling liquid into the housing. The housing includes an outlet for allowing the cooling fluid to exit from the housing. The heat dissipation apparatus includes a heat dissipating member disposed in the housing. The heat dissipation apparatus includes a buffer member disposed between the inlet and the heat dissipating member in the housing. The buffer member includes a plurality of through-holes for inhibiting a flow of the cooling liquid from the inlet of the housing to the heat dissipating member to transfer heat across the heat dissipating member to the cooling fluid.

One embodiment includes a method. The method includes providing a housing including an inlet and an outlet. The method includes providing a heat dissipating member disposed in the housing. The method includes providing a buffer member disposed between the inlet and the heat dissipating member. The method includes providing through-holes disposed on the buffer member. The method includes introducing a cooling fluid into the housing. The method includes inhibiting a flow of the cooling fluid from the inlet to the heat dissipating member. The method includes transferring heat across the heat dissipating member to the cooling fluid. The method includes allowing the cooling fluid to exit from the housing.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, embodiments will be described and explained with additional specificity and detail through the use of the accompanying drawings, in which.

DETAILED DESCRIPTION

It can be seen from the above that the heat dissipation apparatus provided by the present disclosure can dissipate the heat from the surface of the processor by a cooling fluid (e.g. water) successively flowing into the inlet on the housing, through the buffer member and the heat dissipating member, and then out of the outlet on the housing, thereby alleviating the impact of the heat generated inside the electronic device on its processor, which may improve the processing performance of the processor. It should be appreciated that other cooling fluids, such as cooling gases, may be used instead of water.

In addition to improving the heat dissipation of the electronic device by heat conduction of the heat dissipating member and the buffer member, the heat dissipation apparatus provided by the embodiments of the present disclosure may, by virtue of the plurality of through-holes provided on the buffer member, improve the heat conduction efficiency of the heat dissipating member by speeding up the water flow through the buffer member to the heat dissipating member. The heat dissipation apparatus may increase the impact force of the water flow impacting the surface of the heat dissipating member to create a boundary layer around the impact point on the surface of the heat dissipating member. When flowing through the through-holes on the buffer member, the water flowing through the inlet of the housing is not only under the force of gravity in the vertical direction, but is also under the force applied by the water flow in the non-through-hole region around the through-holes. The heat dissipation of the heat dissipation apparatus may further improve, alleviating the impact of the heat generated inside the electronic device on its processor, and improving the processing performance of the processor.

In the following, particular embodiments of the present disclosure are described in detail in connection with the accompanying drawings. Some particular details are set forth in the following description to provide a thorough understanding of the present disclosure. However, the present disclosure can be embodied in various manners other than those described herein, and similar application can be made by those skilled in the art without departing from the spirit and scope of the present disclosure. Accordingly, the present disclosure will not be restricted by the embodiments as disclosed below.

Figure 1:
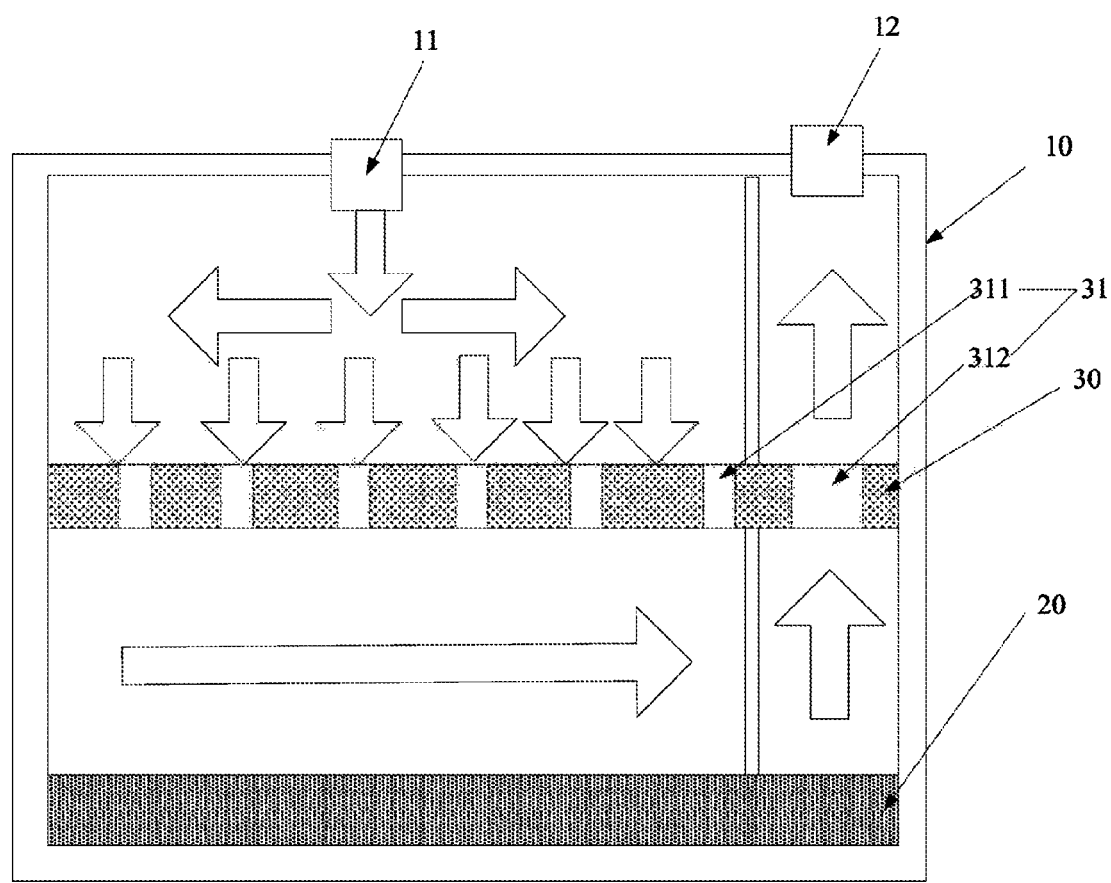
FIG. 1 is a structural diagram of a heat dissipation apparatus provided by an embodiment of the present disclosure.

Embodiments of the present disclosure provide a heat dissipation apparatus suitable for a processor in an electronic device. As illustrated in FIG. 1, in one embodiment the heat dissipation apparatus includes a housing 10. The housing 10 may include a hermetically sealed cavity. The housing 10 includes an inlet 11 and an outlet 12. The inlet 11 may introduce a cooling liquid into the housing 10. The outlet 12 may allow the cooling liquid to exit from the housing 10. The heat dissipation apparatus includes a heat dissipating member 20. The heat dissipating member 20 may be disposed in the housing 10 and/or hermetically sealed cavity at the bottom of the housing 10. The heat dissipation apparatus includes a buffer member 30. The buffer member 30 may be disposed in the hermetically sealed cavity above the heat dissipating member 20. The buffer member 30 includes multiple through-holes 31 through the buffer member 30. The multiple through-holes 31 may inhibit a flow of the cooling fluid from the inlet 11 of the housing 10 to the heat dissipating member 20 to transfer heat across the heat dissipating member 20 to the cooling fluid.

Figure 2:
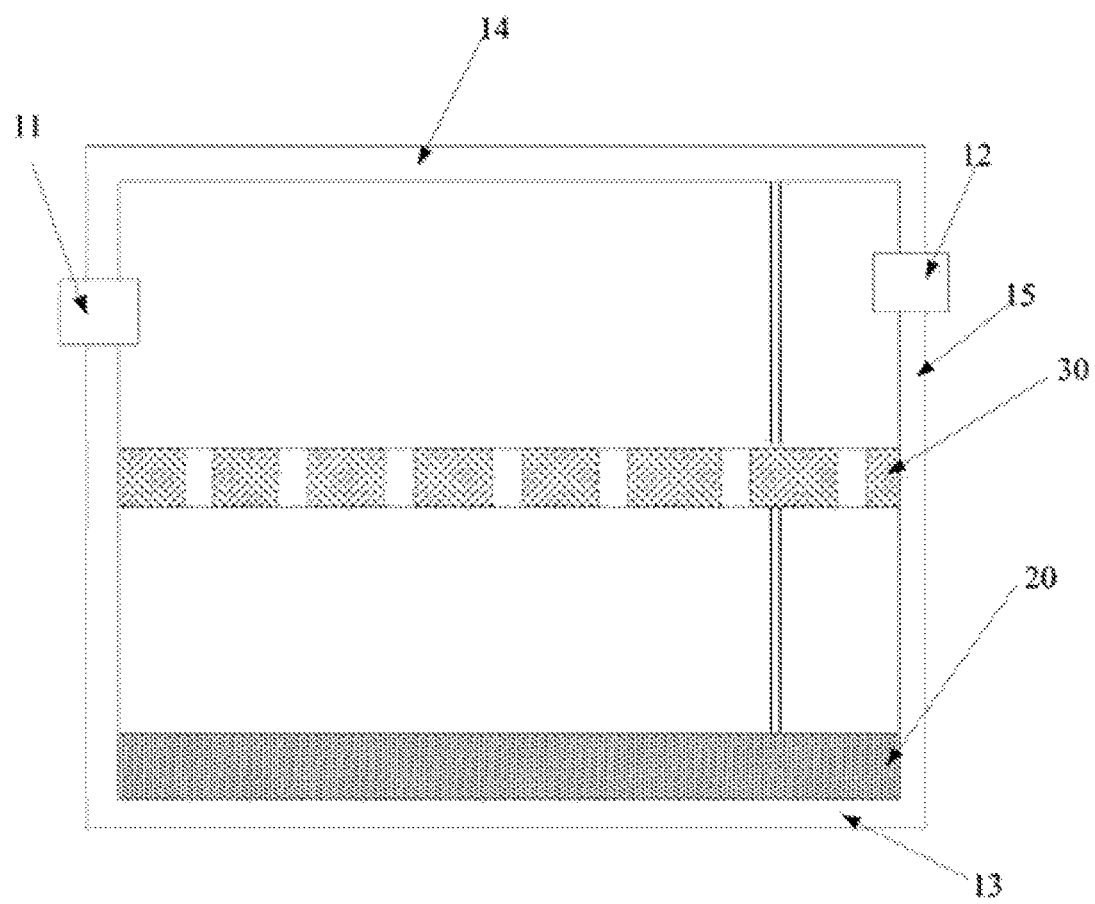
FIG. 2 is a structural diagram of a heat dissipation apparatus provided by another embodiment of the present disclosure.
Figure 3:
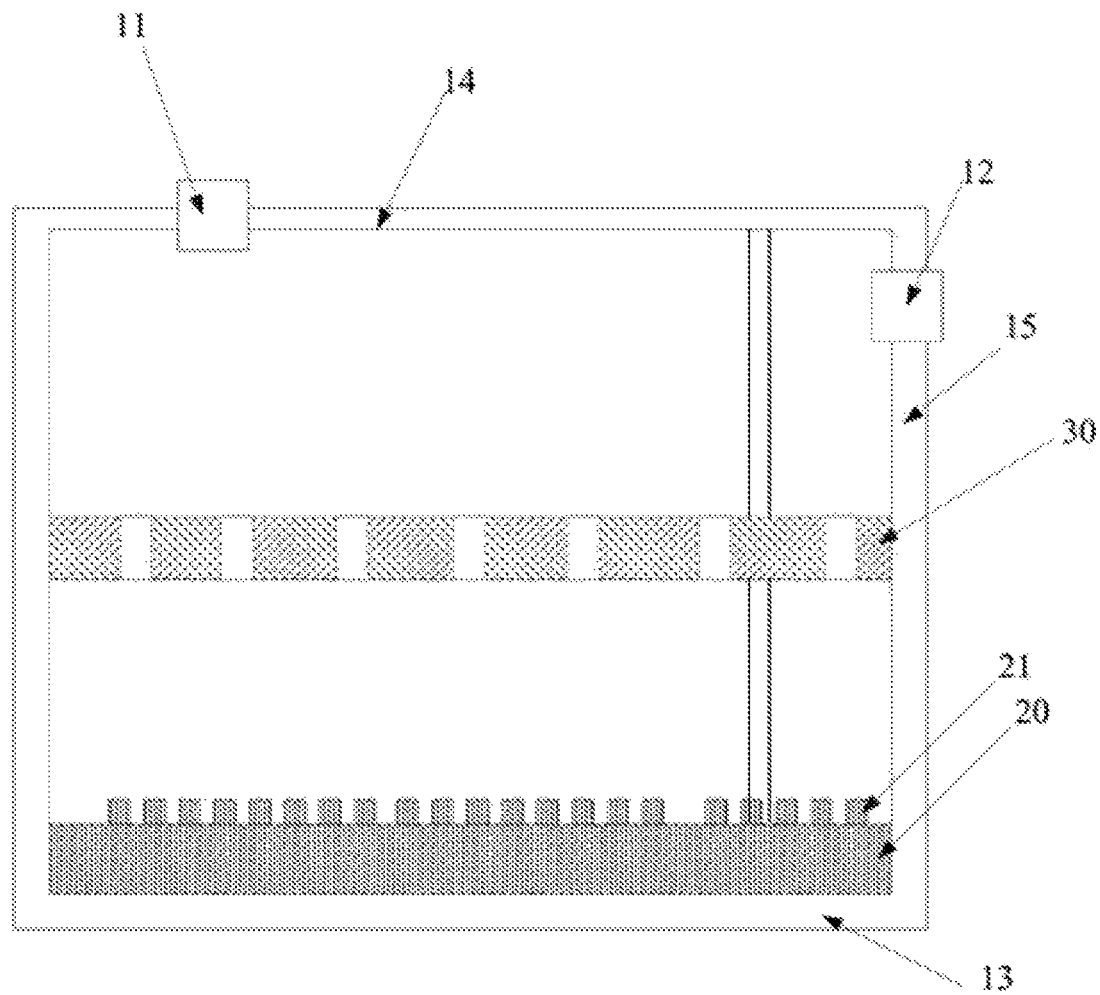
FIG. 3 is a structural diagram of a heat dissipation apparatus provided by a further embodiment of the present disclosure.

As illustrated in FIGS. 1-3, in one embodiment of the present disclosure, the housing 10 includes a bottom baseplate 13, a top cover plate 14, and a sidewall 15 fixedly connected to the bottom baseplate 13 and the top cover plate 14. In one embodiment of the present disclosure, as illustrated in FIG. 1, the inlet 11 and the outlet 12 are provided on the top cover plate 14, that is, the top cover plate 14 is provided with the inlet 11 and the outlet 12. In one embodiment of the present disclosure, as illustrated in FIG. 2, the inlet 11 and the outlet 12 are provided on the sidewall 15. In one embodiment of the present disclosure, as illustrated in FIG. 3, one inlet 11 and outlet 12 can be provided on the top cover plate 14, while the other is provided on the sidewall 15.

It should be noted that, in one embodiment, when the inlet 11 is provided on the sidewall 15, the inlet 11 may be located in the region of the sidewall 15 between the buffer member 30 and the top cover plate 14 and water flowing into through the inlet 11 may flow through the buffer member 30 and then to the heat dissipating member 20.

In one embodiment of the present disclosure, when the inlet 11 is located on the top cover plate 14 or on the sidewall 15 between the buffer member 30 and the top cover plate 14, the through-holes 31 on the buffer member 30 include a plurality of first through-holes 311 and at least one second through-hole 312. The first through-holes 311 communicate with the inlet 11. Water flowing into through the inlet 11 may flow to the heat dissipating member 20 through the first through-holes 311 on the buffer member 30. The second through-hole 312 communicates with the outlet 12. Water that has already flowed through the heat dissipating member 20 for heat dissipation, may flow towards the outlet 12 through the second through-hole 312 on the buffer member 30, and then flow out of the outlet 12.

In one embodiment of the present disclosure, the sum of the areas of the through-holes 31 on the buffer member 30 occupies 30% to 40% of the area of the buffer member 30, inclusively. The sum of the areas may take into account both the water flow velocity in the through-holes 31 and the water flow throughput of the entire buffer member 30, which may improve the heat dissipation of the heat dissipation apparatus. In some embodiments of the present disclosure, the through-holes 31 of the buffer member 30 may be shaped as circles, rectangles, ellipses, or the like.

In one embodiment of the present disclosure, both the heat dissipating member 20 and the buffer member 30 are made of thermally conductive material. In one embodiment, higher thermal conductivity of the material of the heat dissipating member 20 and the buffer member 30 may further improve the heat dissipation of the heat dissipation apparatus. The thermally conductive material may include stainless steel, aluminum, or copper.

In one embodiment of the present disclosure, the buffer member 30 is produced by a stamping process. The stamping process may improve its manufacturing yield and reduce its manufacturing cost and/or the manufacturing cost of the heat dissipation apparatus. However, in other embodiments of the present disclosure the buffer member 30 may be produced by other processes.

In one embodiment of the present disclosure, as further illustrated in FIG. 3, the heat dissipating member 20 is provided with multiple protrusions 21 on the surface. The protrusions 21 may increase the area of the heat dissipating member 20 contacting the water flow when water in the housing 10 and/or hermetically sealed cavity is flowing through the heat dissipating member 20. The increased area may improve the heat dissipation of the heat dissipating member 20.

In a one embodiment of the present disclosure, at least part of the surface of the heat dissipating member 20 and the protrusions 21 is a rough surface. The rough surface may increase the area of the heat dissipating member 20 contacting the water flow when water in the housing 10 (which may include the hermetically sealed cavity) is flowing through the heat dissipating member 20, which may improve the heat dissipation of the heat dissipating member 20. In one embodiment of the present disclosure, the rough surface of the heat dissipating member 20 and the protrusions 21 is produced by a sandblasting process or another process.

It should be noted that in one embodiment, the buffer member 30 may include a thermally conductive material and at least part of the surface of the buffer member 30 may include a rough surface, which may improve the heat dissipation of the buffer member 30. The rough surface of the buffer member 30 may also produced by a sandblasting process or another process.

In one embodiment of the present disclosure, the water flow direction of the inlet 11 may be in parallel with or perpendicular to the surface of the processor in the electronic device. Similarly, the water flow direction of the outlet 12 may be in parallel with or perpendicular to the surface of the processor in the electronic device.

In one embodiment of the present disclosure, the buffer member 30 connects to the housing 10 by welding. In one embodiment of the present disclosure the buffer member 30 connects to the housing 10 by riveting. In some embodiments of the present disclosure the buffer member 30 may connect to the housing 10 by another fixed connection.

In addition, some embodiments of the present disclosure provide an electronic device, including a processor and a heat dissipation apparatus for the processor. The heat dissipation apparatus may include any one of the heat dissipation apparatus provided by the above embodiments.

One embodiment of the present disclosure provides a method. The method includes providing a housing including an inlet and an outlet. For example, the housing may include the housing 10, the inlet 11, or the outlet 12. The method includes providing a heat dissipating member disposed in the housing. For example, the heat dissipating member may include the heat dissipating member 20. The method includes providing a buffer member disposed between the inlet and the heat dissipating member. For example, the buffer member may include the buffer member 30. The method includes providing through-holes disposed on the buffer member. For example, the through holes may include the through-holes 31. The method includes introducing a cooling fluid into the housing. The method includes inhibiting a flow of the cooling fluid from the inlet to the heat dissipating member. The method includes transferring heat across the heat dissipating member to the cooling fluid. The method includes allowing the cooling fluid to exit from the housing.

In one embodiment, the method may include a sum of areas of the through-holes of the buffer member occupying 30% to 40% of an area of the buffer member, inclusively. In one embodiment, the method may further include providing a bottom baseplate, a top cover plate, and a sidewall fixedly connected to the bottom baseplate and the top cover plate, wherein the top cover plate includes an inlet and an outlet. For example, the bottom baseplate, top cover plate, and sidewall may include the bottom baseplate 13, top cover plate 14, and sidewall 15 respectively.

In one embodiment, the method may include the through-holes of the buffer member including first through-holes and at least one second through-hole. For example, the first through-holes may include first through-holes 311 and the second through-hole 312. In one embodiment, the first through-holes communicate with the inlet of the top cover plate, and the second through-hole communicates with the outlet of the top cover plate. In one embodiment, the method may further include providing protrusions disposed on a surface of the heat dissipating member. For example, the protrusions may include the protrusions 21.

In summary, in one embodiment, the heat dissipation apparatus provided by the present disclosure may dissipate the heat from the surface of the processor by water successively flowing into the inlet 11 on the housing 10, through the buffer member 30 and the heat dissipating member 20, and then out of the outlet 12 of the housing 10. In one embodiment, the heat dissipation apparatus may alleviate the impact of the heat generated inside the electronic device on its processor, which may improve the processing performance of the processor.

In addition to improving the heat dissipation of the electronic device by heat conduction of the heat dissipating member 20 and the buffer member 30, the heat dissipation apparatus provided by the embodiments of the present disclosure may, by virtue of the plurality of through-holes 31 provided on the buffer member 30, improve the heat conduction efficiency of the heat dissipating member 20 by speeding up the water flow through the buffer member 30 to the heat dissipating member 20. The heat dissipation apparatus may increase the impact force of the water flow impacting the surface of the heat dissipating member 20 to create a boundary layer around the impact point on the surface of the heat dissipating member 20. In one embodiment, the water flowing through the through-holes 31 on the buffer member 30 into the housing 10 and/or hermetically sealed cavity through the inlet 11 of the housing 10 is not only under the force of gravity in the vertical direction, but also under the force applied by the water flow in the non-through-hole region around the through-holes 31. In one embodiment, the heat dissipation of the heat dissipation apparatus may further improve and alleviate the impact of the heat generated inside the electronic device on its processor, which may improve the processing performance of the processor.

In the present specification, each section is described in a progressive manner, with each section emphasizing its differences with other sections. For identical or similar content among various sections, please refer to the corresponding section.

Those skilled in the art should be able to implement or use the present disclosure after reading the description of the embodiments disclosed above. Various modifications of these embodiments would be apparent to a person skilled in the art, and the general principle defined herein can also be implemented in other embodiments without departing from the spirit or scope of the present disclosure. Accordingly, the present disclosure will not be limited to the embodiments demonstrated herein.

What is claimed is:

1. An apparatus comprising:
   a housing comprising an inlet for introducing a cooling fluid into the housing, and an outlet for allowing the cooling fluid to exit from the housing;
   a heat dissipating member disposed in the housing; and
   a buffer member disposed between the inlet and the heat dissipating member in the housing, the buffer member comprising a plurality of through-holes for inhibiting a flow of the cooling fluid from the inlet of the housing to the heat dissipating member to transfer heat across the heat dissipating member to the cooling fluid;
   wherein a sum of areas of the through-holes of the buffer member occupies 30% to 40% of an area of the buffer member, inclusively.

2. The apparatus of claim 1, wherein the buffer member comprises thermally conductive material.

3. The apparatus of claim 2, wherein the thermally conductive material is stainless steel, aluminum, or copper.

4. The apparatus of claim 3, wherein the buffer member is produced by a stamping process.

5. The apparatus of claim 1, wherein the buffer member connects to the housing by at least one of: welding and riveting.

6. The apparatus of claim 1, wherein the heat dissipating member comprises a plurality of protrusions disposed on a surface.

7. The apparatus of claim 6, wherein at least part of the surface of the heat dissipating member and the plurality of protrusions comprises a rough surface.

8. The apparatus of claim 7, wherein the rough surface of the heat dissipating member and the protrusions are produced by a sandblasting process.

9. The apparatus of claim 1, wherein the housing comprises a bottom baseplate, a top cover plate, and a sidewall fixedly connected to the bottom baseplate and the top cover plate, wherein the top cover plate comprises an inlet and an outlet.

10. The apparatus of claim 9, wherein the plurality of through-holes of the buffer member comprise a plurality of first through-holes and at least one second through-hole, wherein the first through-holes communicate with the inlet of the top cover plate, and the second through-hole communicates with the outlet of the top cover plate.

11. The apparatus of claim 1, wherein the housing comprises a hermetically sealed cavity.

12. The apparatus of claim 11, wherein the heat dissipating member is disposed within the hermetically sealed cavity.

13. The apparatus of claim 12, wherein the buffer member is disposed within the hermetically sealed cavity above the heat dissipating member.

14. An electronic device comprising:
   a processor; and,
   an apparatus comprising:
   a housing comprising an inlet for introducing a cooling fluid into the housing, and an outlet for allowing the cooling fluid to exit from the housing:
   a heat dissipating member disposed in the housing, the heat dissipating member being operative to transfer heat away from the processor; and a buffer member disposed between the inlet and the heat dissipating member in the housing, the buffer member comprising a plurality of through-holes for inhibiting a flow of the cooling fluid from the inlet of the housing to the heat dissipating member to transfer heat across the heat dissipating member to the cooling fluid;

wherein a sum of areas of the through-holes of the buffer member occupies 30% to 40% of an area of the buffer member, inclusively.

15. A method comprising:

providing a housing comprising an inlet and an outlet;

providing a heat dissipating member disposed in the housing;

providing a buffer member disposed between the inlet and the heat dissipating member;

providing a plurality of through-holes disposed on the buffer member;

introducing a cooling fluid into the housing;

inhibiting a flow of the cooling fluid from the inlet to the heat dissipating member;

transferring heat across the heat dissipating member to the cooling fluid; and allowing the cooling fluid to exit from the housing;

wherein a sum of areas of the through-holes of the buffer member occupies 30% to 40% of an area of the buffer member, inclusively.

16. The method of claim 15, further comprising providing a bottom baseplate, a top cover plate, and a sidewall fixedly connected to the bottom baseplate and the top cover plate, wherein the top cover plate comprises an inlet and an outlet.

17. The method of claim 16, wherein the plurality of through-holes of the buffer member comprise a plurality of first through-holes and at least one second through-hole, wherein the first through-holes communicate with the inlet of the top cover plate, and the second through-hole communicates with the outlet of the top cover plate.

18. The method of claim 15, further comprising providing a plurality of protrusions disposed on a surface of the heat dissipating member.

\* \* \* \* \*